(12) United States Patent
Goulette et al.

(10) Patent No.: US 6,368,451 B1
(45) Date of Patent: Apr. 9, 2002

(54) HIGH VOLTAGE FEEDTHROUGH FOR NON-THERMAL PLASMA REACTOR

(75) Inventors: David Alexander Goulette, Marine City; Mark Ray McClanahan, Goodrich; David Emil Nelson, Waterford, all of MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/500,628

(22) Filed: Feb. 9, 2000

(51) Int. Cl.$^7$ .......................... H05H 1/00; C23C 16/00; H01R 13/00; H01B 17/00
(52) U.S. Cl. ..................... 156/345; 118/715; 439/700; 174/152 R
(58) Field of Search ................................ 439/700–824, 439/933, 934, 253, 271, 185, 447; 174/152 R–157 R, 142, 152 E, 12 BH, 14 BH, 262; 118/715; 156/345

(56) References Cited

U.S. PATENT DOCUMENTS

| | | | | |
|---|---|---|---|---|
| 3,920,307 A | * | 11/1975 | Burns .......................... | 439/185 |
| 3,989,341 A | * | 11/1976 | Ball ............................ | 439/185 |
| 4,030,742 A | * | 6/1977 | Eidelberg et al. ............ | 285/343 |
| 4,096,352 A | * | 6/1978 | Zweck ..................... | 174/153 R |
| 4,687,417 A | * | 8/1987 | Amboss ....................... | 417/49 |
| 4,835,341 A | * | 5/1989 | Katz et al. ................... | 174/142 |
| 5,200,578 A | * | 4/1993 | Brucker .................. | 174/152 R |
| 5,344,337 A | * | 9/1994 | Ritter ......................... | 439/447 |

\* cited by examiner

*Primary Examiner*—Gregory Mills
*Assistant Examiner*—P. Hassanzadeh
(74) *Attorney, Agent, or Firm*—Vincent A. Cichosz

(57) ABSTRACT

High voltage feedthrough connectors provide a means for isolating high voltage through a reactor housing while providing thermal expansion tolerance along with ease of assembly. The connectors provide an insulating body having a bore extending axially through said insulating body for housing a center conductor, a threaded shell assembly for engaging the insulating body and securing the insulating body to a NTP reactor housing, and a gas tight seal to prevent gas leaks to the center conductor. The center conductor includes a first end for contacting a high voltage source and a second end for contacting a high voltage electrode of a NTP reactor. In one embodiment, a fixed center conductor is provided. Preferably, a dome shaped tip may be provided on the bottom terminal connector for improved contact with the non-thermal plasma reactor high voltage electrode. Optionally, a compression spring is attached to the bottom terminal connector end of the fixed center conductor. An alternate embodiment provides a movable center conductor and a compression spring riding within the bore of the insulating body. The insulating body is extended a sufficient distance from the threaded shell assembly and the reactor housing to prevent arcing and forms an integral spring collar guide-dielectric barrier skirt.

The various embodiments provide the advantage of a simplified assembly wherein assembly may be accomplished all from one side of the hex nut. In one embodiment, the feedthrough provides a combination of top down and bottom assembly. Another embodiment provides a substantially top down assembly. The high voltage feedthrough can be readily applied to different reactor configurations with similar ease of assembly.

39 Claims, 3 Drawing Sheets

HIGH VOLTAGE FEEDTHROUGH FOR NON-THERMAL PLASMA REACTOR

TECHNICAL FIELD

The present invention relates to a high voltage feedthrough and more particularly relates to a high voltage feedthrough for non-thermal plasma reactors.

BACKGROUND OF THE INVENTION

Non-thermal plasma (NTP) reactors have been shown to be effective at reducing NOx emissions from diesel engines to new legislated levels. It is necessary to connect a high voltage feedthrough from the power source through the NTP reactor package to the high voltage connection on the NTP reactor. Characteristics desired in the high voltage feedthrough include the capability to: 1) pass high voltage from the input cable to the reactor without leakage of current to the housing or peripheral parts; 2) provide connections that are extremely long lasting; 3) minimize electrical noise effects; 4) provide a gas tight seal so that untreated emissions can't escape; and 5) be low cost.

Many connector designs are known in the electrical industry. However, these designs lack compliant contact and hermetic sealing capability, two important features for NTP reactors. For example, the side wire may be removed from standard spark plugs to arrive at a possible feedthrough device, but the resultant device lacks dielectric shielding capability to prevent arcing of the center electrode to the housing and does not provide compliant contact. Such modified spark plug-insulator bodies do not extend far enough to preclude arcing. In such a device, the electrode end is flat, causing line or point contact with orientation variation. High voltage electrical feedthrough devices known in the art for radios, etc., lack hermetic sealing capability.

What is needed in the art is a high voltage feedthrough for NTP reactors providing improved dielectric shielding, longevity, minimal noise, hermetic sealing, compliant contact, ease of assembly and low cost characteristics.

SUMMARY OF THE INVENTION

High voltage feedthrough connectors in accordance with the present invention provide a durable, gas tight electrical connection from an external power source to a high voltage electrode of a NTP reactor. The connectors provide a means for isolating high voltage through a reactor housing while providing thermal expansion tolerance along with ease of assembly. The connectors comprise an insulating body having a bore of substantially single inner diameter extending axially therethrough; a center conductor disposed within said bore and comprising a first end and a second end, said first end of said center conductor having a top terminal connector for providing electrical connection to a high voltage supply and said second end of said center conductor having a bottom terminal connector for providing electrical connection to a high voltage electrode of a NTP reactor; a gas tight seal for preventing gas leaks to said center conductor; and a threaded shell assembly for engaging and connecting the insulating body-center conductor to a NTP reactor housing. The insulating body extends a sufficient distance from the threaded shell assembly and the NTP reactor housing to prevent arcing between the center conductor and the threaded shell assembly or the NTP reactor housing.

In one embodiment, a fixed center conductor provides a highly simplified design without the use of springs. In a preferred embodiment, the bottom terminal connector comprises a dome shaped tip that provides improved contact with the NTP reactor high voltage electrode and compensates for alignment variation in the NTP reactor assembly. In another embodiment, a compression spring disposed on the bottom terminal connector provides compliant contact and electrical connection to the NTP reactor high voltage electrode.

An embodiment comprising a movable center conductor provides a compression spring disposed within the bore of the insulating body in movable contacting engagement with the center conductor. In the spring-loaded embodiments, the insulating body forms an integral spring collar guide-dielectric barrier skirt thus combining spring alignment and compliant contact functions for a simplified, low cost design. If desired, a button electrode may be used.

The present high voltage feedthrough connectors afford the advantages of a simplified assembly that can be accomplished all from one side of the hex nut. The connectors can be readily applied to different reactor configurations with similar ease of assembly. One embodiment provides a combination of top down and bottom assembly. Another embodiment provides a substantially top down assembly.

The present high voltage feedthrough connectors compensate for manufacturing tolerances and thermal expansion of the reactor while maintaining adequate arcing resistance. The connectors combine formerly discrete pieces, thus reducing overall cost. The substantially single inner diameter of the bore of insulating body (excepting the threaded top section) further contributes to the overall low cost of the present high voltage feedthrough. The channel-guided spring design inhibits arcing, provides improved longevity, low manufacturing cost, and hermetic, automotive-type connections.

BRIEF DESCRIPTION OF THE DRAWINGS

Referring now to the drawings, which are meant to be exemplary, not limiting, and wherein like elements are numbered alike in the several Figures.

DESCRIPTION OF THE PREFERRED EMBODIMENT

Figure 1:
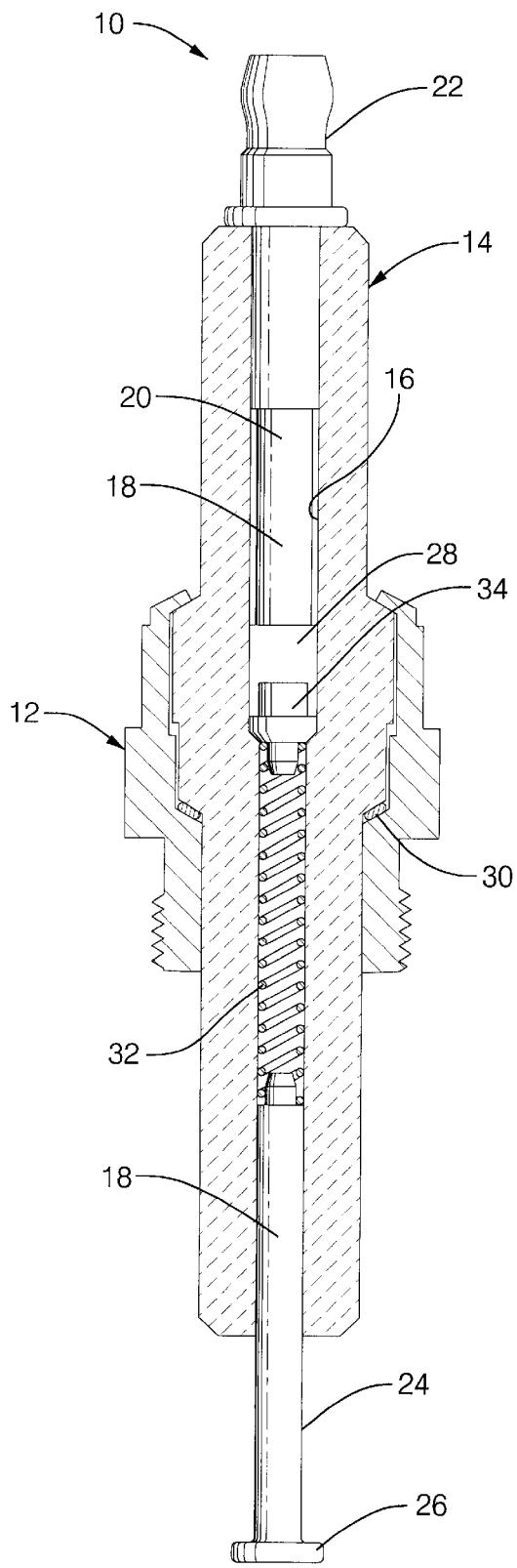
FIG. 1 is a view in partial cross-section of an embodiment of the present high voltage feedthrough having a movable center conductor, an internal spring and providing a combination of top and bottom assembly.

Referring now to the drawings in detail, the following description is provided with respect to the various embodiments shown in FIGS. 1 through 5. The description and drawings further exemplify the ease of assembly achieved with the various embodiments of the present high voltage feedthrough. Turning first to FIG. 1, numeral 10 generally indicates one possible embodiment of the present high voltage feedthrough for NTP reactors providing a durable, gas tight electrical connection from an external power source (not shown) to a high voltage electrode of a NTP reactor. The embodiment of FIG. 1 provides a movable center conductor and a top and bottom loaded assembly design. The present high voltage feedthrough includes a threaded shell assembly 12 (for example, a hex nut) engaging insulating body 14. Threaded shell assembly 12 provides ease of insertion of the high voltage feedthrough 10 into a NTP reactor housing (not shown) and allows the high voltage feedthrough 10 to be applied easily to different NTP reactor configurations.

Insulating body 14 includes a bore 16 extending axially therethrough for housing center conductor 18. Insulating body 14 extends away from the threaded shell assembly 12 and the NTP reactor housing sufficient to eliminate the potential for arcing between the center conductor 18 and the threaded shell assembly 12 or the NTP reactor housing. The insulating body 14 may be formed from any material providing suitable insulating properties, including, but not limited to, alumina, steatite, cordierites, mullite, plastics, or combinations thereof.

Center conductor 18, disposed within the bore 16 of the insulating body 14, serves as contact electrode. Movable center conductor 18 includes a top center conductor section 20 having a top terminal connector 22 for providing electrical connection to a high voltage supply (not shown), and a bottom center conductor section 24 having a bottom terminal connector 26 for providing electrical connection to the high voltage electrode of a NTP reactor.

Seal 28 prevents gas leaks to the center conductor 18 and may comprise any material suitable for providing a gas tight seal, including, but not limited to, a glass seal, ceramic cement, talc pack, polymer, or a combination thereof. Locking tabs may also be used, if desired. Gasket 30 provides an additional gas tight seal around the insulating body 14.

Compression spring 32 rides within the bore 16 of the insulating body 14 between the top center conductor section 20 and the bottom center conductor section 24 and is in movable, contacting engagement with the center conductor 18, providing compensation for part-to-part variation and thermal expansion of the NTP reactor. The arrangement provides alignment of the spring 32 within the bore 16 and compliant contact of the center conductor 18 for high device longevity and accurate placement. Button electrode 34 may be employed when a top loaded assembly is not desired.

Generally, the combination top and bottom loaded assembly of the embodiment of FIG. 1 comprises inserting button electrode 34 top down into the insulating body 14, pouring and tamping sealing material (which forms the seal 28) into the insulating body 14 through the bore 16, and inserting the top terminal connector 22 into the insulating body 14. Assembly proceeds with heating of the partially assembled high voltage feedthrough 10 at a temperature and pressure selected in accordance with the sealing material requirements, along with pressing on the top terminal connector 22, to seal. Assembly further comprises inserting spring 32 from the bottom (i.e. bottom center conductor 24 end) of the insulating body 14 and attaching the bottom terminal connector 26 to the bottom center conductor 24, with pressing on the bottom terminal connector 26. Assembly further comprises inserting the gasket 30 onto the insulating body 14 and inserting the insulating body 14 subassembly into the threaded shell 12, crimping to seal.

Figure 2:
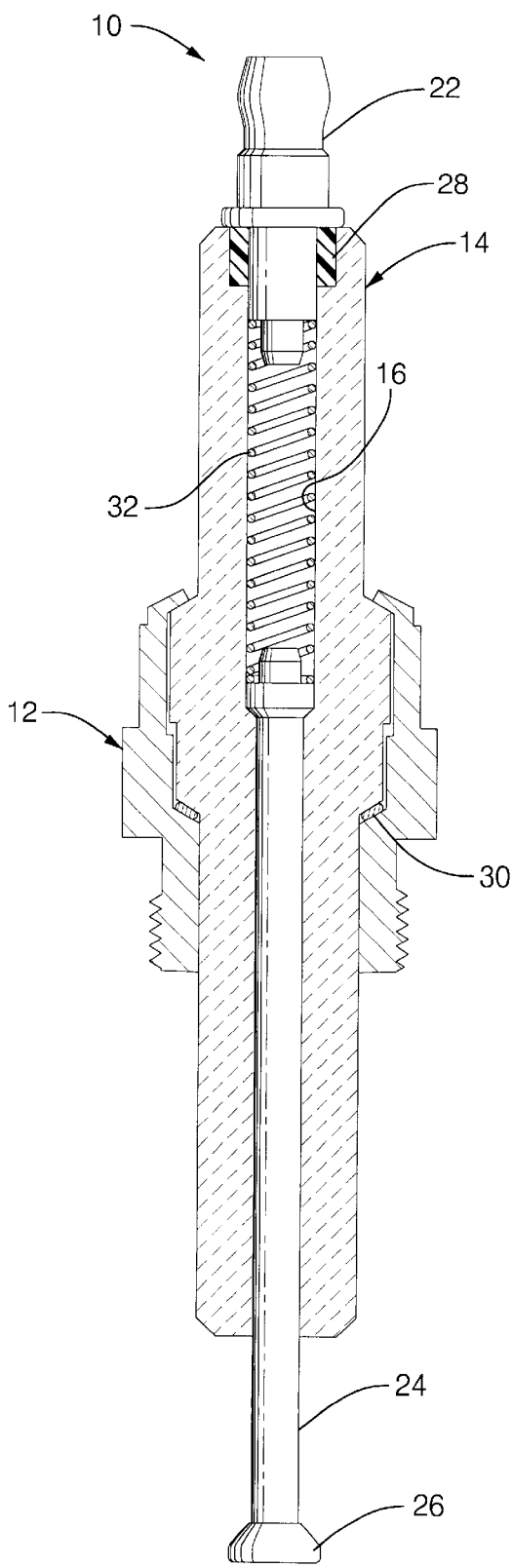
FIG. 2 is a view in partial cross-section of an embodiment of the present high voltage feedthrough having a movable center conductor, an internal spring and providing top-loaded assembly.

The embodiment shown in FIG. 2 provides the advantage of top down assembly. Such assembly generally comprises inserting top down into the bore 16 the bottom center conductor 24, the spring 32, the sealing material (which forms the seal 28), and the top terminal connector 22, thereby sealing and retaining the spring 32. Assembly further comprises inserting the bottom terminal connector 26 into the bottom center conductor 24, installing the gasket 30 onto the insulating body 14, inserting the created insulating body 14 subassembly into the threaded shell 12 and crimping to secure.

Figure 3:
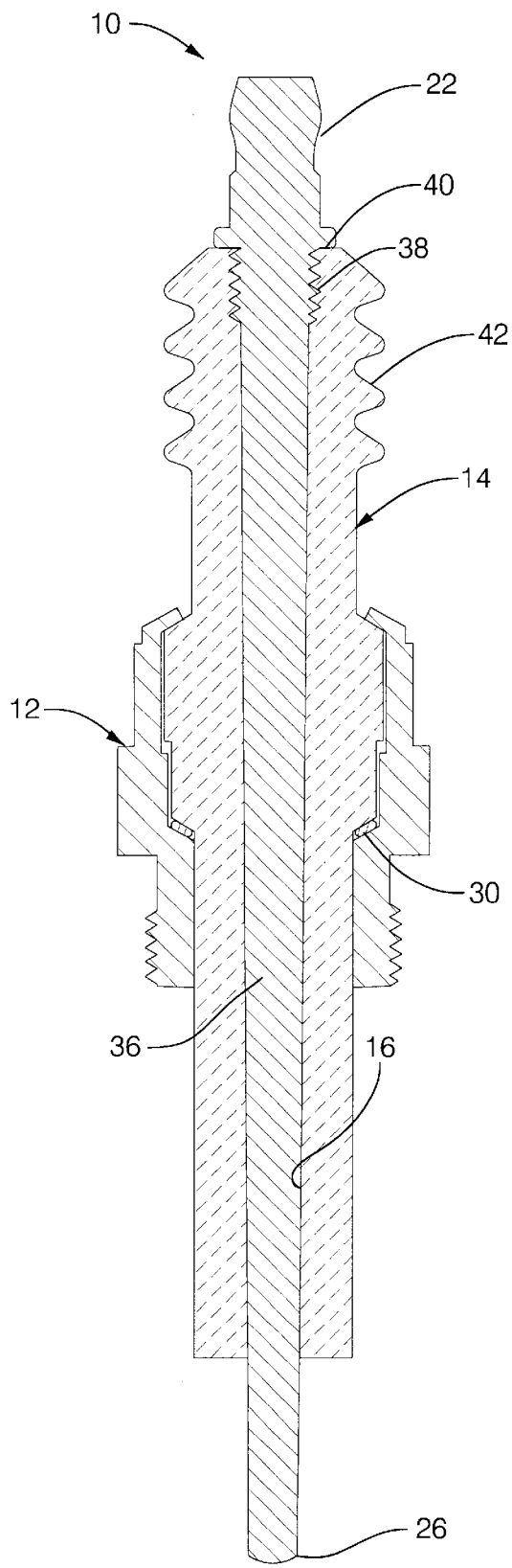
FIG. 3 is a view in partial cross-section of an embodiment of the present high voltage feedthrough having a fixed center conductor.

Turning to FIG. 3, an alternate embodiment of the present high voltage feedthrough 10 having a fixed center conductor 36 is provided. As with the embodiment shown in FIG. 2, the embodiment of FIG. 3 provides the advantage of one sided, top down assembly. During assembly, the fixed center conductor 36 is disposed within the bore 16 of the insulating body 14. Fixed center conductor 36 may be threaded to the insulating body 14 via the threaded conductive post 38. Seal 40 is applied to the threaded conductive post 38 to secure the fixed center conductor 36 within the bore 16 of the insulating body 14. Seal 40 may comprise threads having ceramic paste disposed thereon, a glass seal, or similar materials known in the art. Top terminal connector 22 is inserted top down into the insulating body 14. Gasket 30 is inserted onto insulating body 14 and the insulating body 14 subassembly is inserted into the threaded shell 12 and crimped to secure. Gasket 30 may comprise any suitable gasket known in the art, such as, but not limited to, a copper washer.

In a preferred embodiment, for example the embodiment shown in FIG. 3, a domed tip profile may be provided on the bottom terminal connector 26 of the center conductor 18. The dome-shaped tip serves to compensate for alignment variation in the NTP reactor assembly.

An essentially single inner diameter for the bore 16 of the insulating body 14, except for threads 38 for securing the conductive post 36, provides a simplified tooling design. Ridges 42 disposed on the insulating 10 body 14 provide a tortuous path surface thus reducing the potential for electrical leakage on the surface. Thus, reduced overall cost is provided through a minimal number of parts and ease of assembly.

Figure 4:
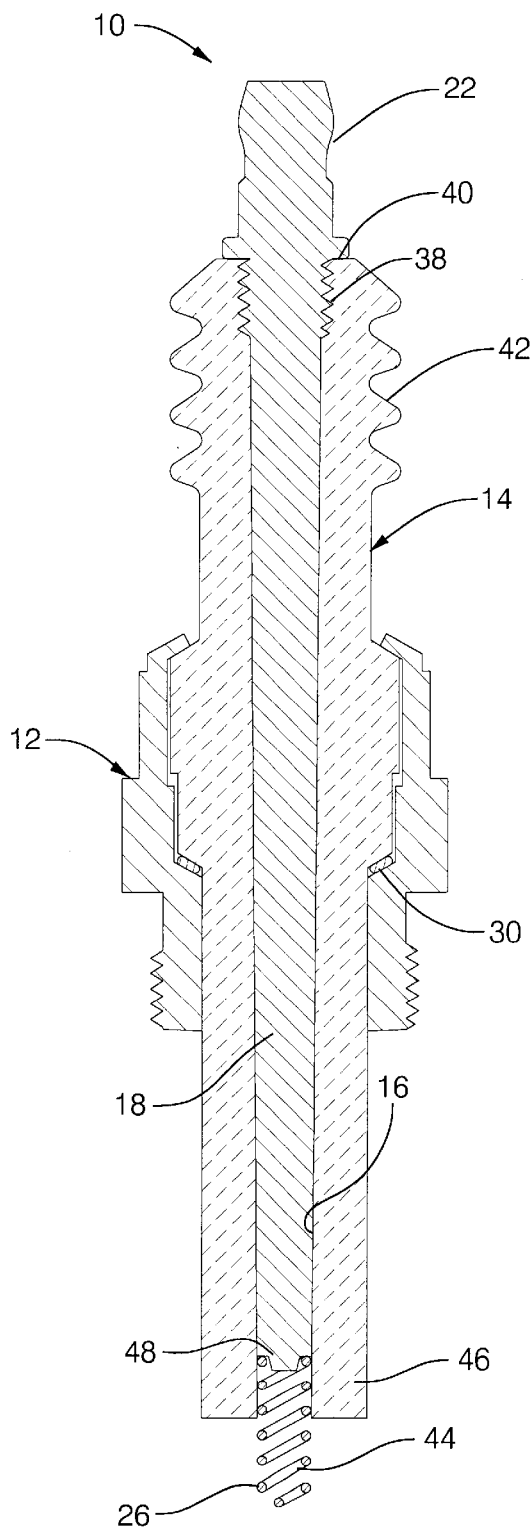
FIG. 4 is a view in partial cross-section of an embodiment of the present high voltage feedthrough having a spring connected to an end of a fixed center conductor.

FIG. 4 provides yet another embodiment of the present high voltage feedthrough 10 having a fixed center conductor 18. The embodiment of FIG. 4 provides a compression spring 44 welded to the shoulder barb (or weld connect) 48 of the fixed center conductor 18. Spring 44 serves as the bottom terminal connector 26. Alternatively, a button electrode may be secured to spring 44.

The insulating body 14 extends sufficiently long so as to serve as a collar guide 46 for the compression spring 44. The fixed center conductor 18 has a reduced diameter at the NTP connector end allowing the welded spring 44 and the fixed center conductor 18 to fit within the inner diameter of the bore 16. The embodiment provides compliant contact and increased capability to accommodate position variation as well as high longevity.

Assembly generally comprises applying a seal 40, such as, for example, threads having ceramic paste disposed thereon, glass seal, or the like, to the threaded conductive post 38. Assembly comprises inserting the fixed center conductor 18 into the insulating body 14, inserting the compression spring 44 into the collar guide 46, and heating sufficient to the specific requirements of the sealing material forming seal 40. Assembly further comprises inserting the gasket 30 onto the insulating body 14, inserting the formed insulating body 14 subassembly into the threaded shell assembly 12, and crimping to secure.

Figure 5:
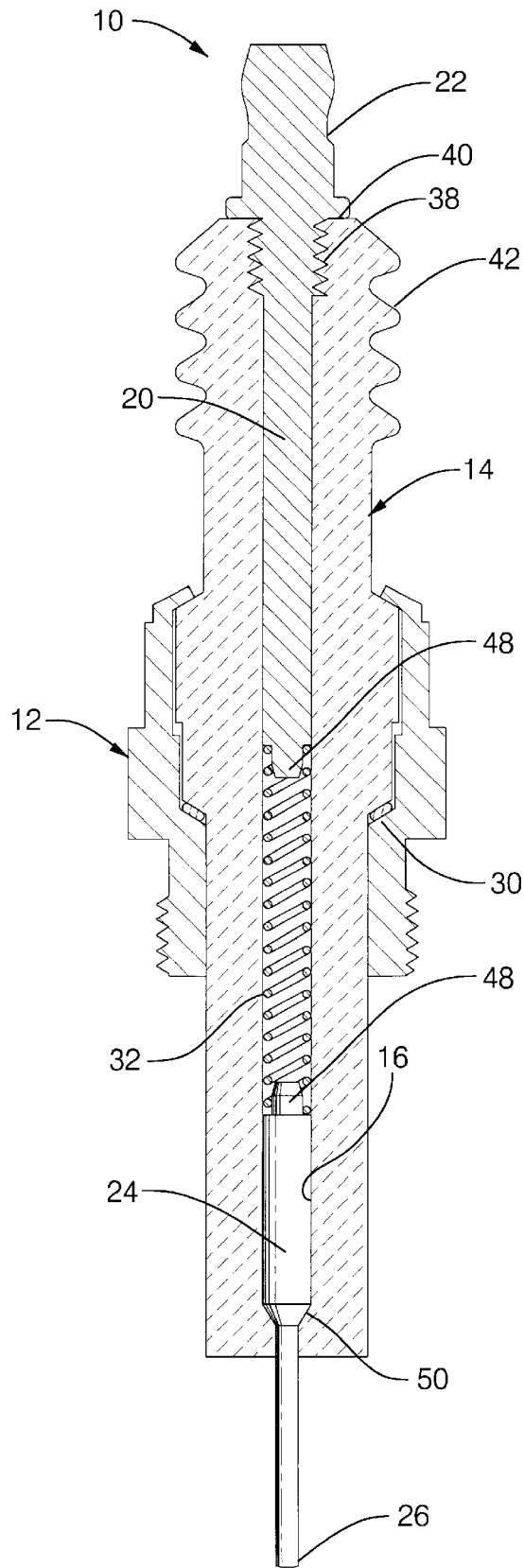
FIG. 5 is a view in partial cross-section of an alternate embodiment of the present high voltage feedthrough similar to the embodiment of FIG. 2 having an internal spring.

FIG. 5 shows an alternate embodiment of a spring-loaded high voltage feedthrough having a compression spring 32 disposed within the bore 16 of the insulating body 14. In the embodiment shown in FIG. 5, insulating body 14 forms an integral extension stop 50 for the bottom center conductor section 24. Compression spring 32 is connected to the top center conductor section 20 and the bottom center conductor 24 via shoulder barbs 48 provided on the top center conductor section 20 and the bottom center conductor section 24. This embodiment provides the advantage of top down assembly, similar to that of FIG. 2.

It will be understood that a person skilled in the art may make modifications to the preferred embodiments shown herein within the scope and intent of the claims. While the present invention has been described as carried out in specific embodiments thereof, it is not intended to be limited thereby but is intended to cover the invention broadly within the scope and spirit of the appended claims.

What is claimed is:

1. A high voltage feedthrough for a non-thermal plasma reactor comprising:
   an insulating body having a bore extending axially through said insulating body;
   a compliant contact center conductor disposed within said bore and comprising a first end and a second end, said first end of said center conductor having a top terminal connector for providing electrical connection to a high voltage supply and said second end of said center conductor having a bottom terminal connector for providing electrical connection to a high voltage electrode of a non-thermal plasma reactor;
   a gas tight seal for preventing gas leaks to said center conductor; and
   a threaded shell assembly for engaging and connecting said insulating body to a non-thermal plasma reactor housing.

2. The high voltage feedthrough of claim 1, wherein said center conductor is fixed.

3. The high voltage feedthrough of claim 2, further comprising:
   a compression spring disposed in compliant contacting relationship with said second end of said fixed center conductor.

4. The high voltage feedthrough of claim 3, wherein said fixed center conductor serves as a collar guide for said compression spring.

5. The high voltage feedthrough of claim 3, wherein said insulating body forms an integral spring collar guide-dielectric barrier skirt.

6. The high voltage feedthrough of claim 1, wherein said center conductor is movable.

7. The high voltage feedthrough of claim 6, further comprising:
   a compression spring in movable contacting engagement with said center conductor.

8. The high voltage feedthrough of claim 7, wherein said compression spring is disposed within said bore between said first end and said second end of said center conductor in movable, contacting relation with said center conductor.

9. The high voltage feedthrough of claim 7, wherein said insulating body forms an integral spring collar guide-dielectric barrier skirt.

10. The high voltage feedthrough of claim 7, wherein said insulating body forms an integral extension stop for said center conductor.

11. The high voltage feedthrough of claim 7, wherein said compression spring is connected to said center conductor via shoulder barbs provided on at least one of said first and second ends of said center conductor.

12. The high voltage feedthrough of claim 7, further comprising:
   a button electrode.

13. The high voltage feedthrough of claim 1, wherein said bottom terminal connector of said center conductor comprises a dome-shaped tip.

14. The high voltage feedthrough of claim 1, wherein said insulating body extends a sufficient distance from said threaded shell assembly and said NTP reactor housing to prevent arcing.

15. The high voltage feedthrough of claim 1, wherein said bore of said insulating body comprises a substantially single inner diameter.

16. The high voltage feed through of claim 1, wherein said insulating body comprises a tortuous path surface for inhibiting electrical leakage.

17. The high voltage feed through of claim 1, further comprising:
   a button electrode.

18. The high voltage feedthrough of claim 1, wherein said high voltage feedthrough provides a combination of top down and bottom assembly.

19. The high voltage feedthrough of claim 1, wherein said high voltage feedthrough provides substantially top down assembly.

20. A high voltage feedthrough for a non-thermal plasma reactor comprising:
   an insulating body having a bore extending axially through said insulating body;
   a movable center conductor disposed within said bore, said movable center conductor comprising a first section and a second section, said first section of said movable center conductor having a top terminal connector for providing electrical connection to a high voltage supply and said second section of said movable center conductor having a bottom terminal connector for providing electrical connection to a high voltage electrode of a non-thermal plasma reactor;
   a compression spring riding within said bore of said insulating body between said first section and said second section of said movable center conductor, said compression spring being in movable, contacting engagement with said center conductor, wherein said compression spring provides compliant contact and electrical connection between said center conductor and said non-thermal plasma high voltage electrode;
   a gas tight seal for preventing gas leaks to said center conductor; and
   a threaded shell assembly for engaging and connecting said insulating body to a non-thermal plasma reactor housing.

21. The high voltage feedthrough of claim 20, wherein said bottom terminal connector of said center conductor comprises a dome-shaped tip.

22. The high voltage feedthrough of claim 20, wherein said insulating body extends a sufficient distance from said threaded shell assembly and said nonthermal plasma reactor housing to prevent arcing.

23. The high voltage feedthrough of claim 20, wherein said bore of said insulating body comprises a substantially single inner diameter.

24. The high voltage feed through of claim 20, wherein said insulating body comprises a tortuous path surface for inhibiting electrical leakage.

25. The high voltage feed through of claim 20, further comprising:
a button electrode.

26. The high voltage feedthrough of claim 20, wherein said insulating body forms an integral extension stop for said center conductor.

27. The high voltage feedthrough of claim 20, wherein said compression spring is connected to said center conductor via shoulder barbs provided on at least one of said first and second sections of said center conductor.

28. The high voltage feedthrough of claim 20, wherein said high voltage feedthrough provides a combination of top down and bottom assembly.

29. The high voltage feedthrough of claim 20, wherein said high voltage feedthrough provides substantially top down assembly.

30. A high voltage feedthrough for a non-thermal plasma reactor comprising:
an insulating body having a bore extending axially through said insulating body;
a fixed center conductor having a first end and a second end disposed within said bore, said first end of said center conductor having a top terminal connector for providing electrical connection to a high voltage supply and said second end of said center conductor having a bottom terminal connector for providing electrical connection to a high voltage electrode of a non-thermal plasma reactor, and means for providing compliant contact with said high voltage electrode;
a gas tight seal for preventing gas leaks to said center conductor; and
a threaded shell assembly for engaging and connecting said insulating body to a non-thermal plasma reactor housing.

31. The high voltage feedthrough of claim 30, wherein said means for providing compliant contact is a dome shaped tip on said second end of said center conductor.

32. The high voltage feedthrough of claim 30, wherein said means for providing compliant contact is a compression spring disposed in compliant contacting relationship with said second end of said fixed center conductor.

33. The high voltage feedthrough of claim 32, wherein said fixed center conductor serves as a collar guide for said compression spring.

34. The high voltage feedthrough of claim 32, wherein said insulating body forms an integral spring collar guide-dielectric barrier skirt.

35. The high voltage feedthrough of claim 32, wherein said compression spring is connected to said center conductor via shoulder barbs provided on and second end of said center conductor.

36. The high voltage feedthrough of claim 30, wherein said insulating body extends a sufficient distance from said threaded shell assembly and said nonthermal plasma reactor housing to prevent arcing.

37. The high voltage feedthrough of claim 30, wherein said bore of said insulating body comprises a substantially single inner diameter.

38. The high voltage feed through of claim 30, wherein said insulating body comprises a tortuous path surface for inhibiting electrical leakage.

39. The high voltage feedthrough of claim 30, wherein said high voltage feedthrough provides substantially top down assembly.

* * * * *